(12) United States Patent
Maekawa et al.

(10) Patent No.: US 6,741,086 B2
(45) Date of Patent: May 25, 2004

(54) MEMBER FOR REMOVING FOREIGN MATTER ADHERING TO PROBE TIP AND METHOD OF MANUFACTURING THE PROBE TIP, METHOD OF CLEANING FOREIGN MATTER ADHERING TO PROBE TIP, PROBE, AND PROBING APPARATUS

(75) Inventors: Shigeki Maekawa, Tokyo (JP);
Megumi Takemoto, Tokyo (JP);
Yoshihiro Kashiba, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 88 days.

(21) Appl. No.: 10/126,982

(22) Filed: Apr. 22, 2002

(65) Prior Publication Data

US 2002/0190737 A1 Dec. 19, 2002

(30) Foreign Application Priority Data

Jun. 13, 2001 (JP) ........................ 2001-178206
Mar. 18, 2002 (JP) ........................ 2002-073835

(51) Int. Cl.[7] ................................ B08B 1/00
(52) U.S. Cl. .................. 324/754; 324/158.1; 451/59; 451/41
(58) Field of Search ................ 324/754, 758, 324/158.1, 765, 73.1; 451/59; 134/45, 6; 438/14, 18

(56) References Cited

U.S. PATENT DOCUMENTS 6,056,627 A * 5/2000 Mizuta ................ 451/59
6,118,289 A * 9/2000 Kitani et al. ............. 324/754
6,130,104 A * 10/2000 Yamasaka ................ 438/14

FOREIGN PATENT DOCUMENTS

| JP | 7-244074 | 9/1995 |
| JP | 10-300777 | 11/1998 |
| JP | 11-97496 | 4/1999 |
| JP | 11-345846 | 12/1999 |

* cited by examiner

*Primary Examiner*—Kamand Cuneo
*Assistant Examiner*—Jimmy Nguyen
(74) *Attorney, Agent, or Firm*—Leydig, Voit & Mayer, Ltd.

(57) ABSTRACT

The present invention provides a member for removing foreign matter adhering to the spherical tip portion of a test probe which is put into contact with the bonding pads of a semiconductor chip to test the action of the semiconductor chip. The member includes four essential layers of a base plate, a first elastic member on the base plate and flexibly deformable upon contact of the probe, specifically, a predetermined Young's modulus, a second elastic member on the first elastic member and having a tensile strength and a thickness responding to contact stress produced by the contact of the probe, and an abrasive layer on the second elastic member and made of hard particles and a binding material in a volume ratio providing a smooth sliding action of the probe and producing a high abrasive efficiency to any adhering foreign matter. The removing member can smoothly slide the probe to effectively remove the foreign matter adhering to the probe tip.

15 Claims, 8 Drawing Sheets

MEMBER FOR REMOVING FOREIGN MATTER ADHERING TO PROBE TIP AND METHOD OF MANUFACTURING THE PROBE TIP, METHOD OF CLEANING FOREIGN MATTER ADHERING TO PROBE TIP, PROBE, AND PROBING APPARATUS

BACKGROUND OF THE INVENTION

1. Field of the Invention

The present invention relates to a technology for testing the operation of a semiconductor integrated circuit or a display device, that is, a probing technology, and in particular, to a member for the purpose of removing foreign matter adhering to the tip of a probe which is put into contact with a pad for testing the operation of the semiconductor integrated circuit or the display device, for example, metals, metal oxides, and contaminants inhibiting electric contact, a method of manufacturing the removing member, a method of cleaning foreign matter adhering to the probe tip by the use of the removing member, a probe cleaned by the removing member, and a probing apparatus to which the removing member is applied.

2. Description of the Related Art

For example, the probe of a probe card, which serves as an interface for electric signals transferred between a probing apparatus for measuring electric characteristics of a semiconductor integrated circuit formed on a semiconductor wafer (hereinafter referred to as a semiconductor chip) and the semiconductor chip, is forcibly put into contact with the bonding pads which are made of aluminum alloy and formed on the semiconductor chip to scratch the pads. For this reason, aluminum and aluminum oxide scratched from the pad material or contaminants remaining on the surfaces of the bonding pads adhere to the probe tip. If the adhering foreign matters are not removed from the probe tip, the electric resistance (contact resistance) between the probe and boding pads is so increased that the electrical characteristics of the semiconductor chip can not be accurately measured. Further, when the probe is used for a long time with the adhering foreign matters kept deposited on the probe tip, the electric resistance increases as time elapses. As a countermeasure against this phenomenon, conventionally, the probe tip is cleaned at intervals of predetermined times of probing to remove the adhering foreign matters.

For example, Japanese Patent Laid-open No. Hei. 7-244074 discloses an abrasive sheet formed by mixing fine-grained abrasives for grinding in an elastic matrix and then shaping the matrix into a sheet, an abrasive sheet, that is, a cleaning sheet. The cleaning sheet is attached, instead of a semiconductor wafer, onto a wafer moving table of a probing apparatus which is operated to put a semiconductor wafer into contact with a probe card. The wafer moving table is vertically moved to press the tip of the probe against the surface of the cleaning sheet to produce contact friction between the tip face of the probe and the abrasive grains dispersed in the cleaning sheet to thereby remove the foreign matter adhering to the probe tip.

Further, Japanese Patent Laid-Open No. Hei. 11-97496 already published as an invention made by the inventors of the present invention discloses a technology of removing, foreign matter adhering to the probe tip by the use of a cleaning sheet formed by applying a metallic thin coating film having a high tensile strength to the surface of a resin material and then forming a ceramic layer or an abrasive layer with abrasive grains fixed thereto on the surface of the metallic thin film.

Still further, for example, Japanese Patent Laid-open No. Hei. 11-345846 or Japanese Patent Laid-Open No. Hei. 10-300777 discloses a technology of removing foreign matter adhering to the probe tip by use of a cleaning sheet formed by forming a thin film for cleaning on an elastic sheet.

A conventional cleaning sheet for removing foreign matters adhering to the probe tip is formed, for example, by mixing fine-grained abrasives into an elastic matrix, as described above. When the tip of the,probe is pressed on the surface of the cleaning sheet formed in this manner, the cleaning sheet is deformed and, as shown in FIG. 9, the tip of the probe 1 is pressed into the matrix 102 to present the following problem: the fine-grained abrasives 103 grind the probe 1 in a predetermined region to shave and thin the probe tip while repeating cleaning, finally bending or braking the probe 1 itself because the strength of the probe 1 becomes insufficient.

Further, the research carried out by the present inventors has revealed recently that, from the viewpoint of the contact of the probe tip and the semiconductor electrode pad, the probe tip formed in the shape of a nearly spherical surface having a predetermined diameter R deeply related to the thickness of a pad electrode material with which the probe is put into contact or a nearly spherical surface having a flat portion at a portion (hereinafter collectively referred to as a nearly spherical surface) is most suitable. In the case where the probe with a tip formed in such a shape is used for a cleaning method using a conventional cleaning sheet, the probe tip formed in the shape of a nearly spherical surface is shaved and deformed by the cleaning action, resulting in a problem of degrading the electrical contact of the probe.

For this reason, in order to solve the above problems, the present inventors invented a cleaning sheet capable of cleaning the adhering foreign matter while it was deformed along the shape of the probe tip, that is, a removing member, and disclosed the contents of the invention in Japanese Patent Laid-Open No. Hei. 11-97496. However, there was room for improvement as to the raising of dust by the separation or the fallout of abrasives in a ceramic coating abrasive layer or an abrasive grain of abrasive layer formed on the surface of the cleaning sheet.

Further, Japanese Patent Laid-Open No. Hei. 10-300777 or Japanese Patent Laid-Open No. Hei. 1-345846 discloses a technology relating to a cleaning sheet for accomplishing an object similar to the object of the related art, that is, an object of preventing the probe tip from being shaved and deformed when cleaned, but there have been left some problems to be described below for the cleaning sheet to be deformed along the shape of the probe tip and at the same time to exert a grinding function.

In practice, when the probe tip is cleaned by using the cleaning sheet manufactured based on the invention disclosed in the above patent gazette and commercially sold, the cleaning sheet presents a problem that the probe tip plastically deforms and damages the surface of the cleaning sheet to deeply scratch an abrasive grain layer to shorten the life of the cleaning sheet because of the insufficient flexibility of the cleaning sheet, that is, because of high deflection rigidity of the cleaning sheet. Further, there are left some other problems when the cleaning sheet is put into practice, such as difficulty in cleaning the complete region of the probe tip where the foreign matters are attached.

Further, in order to effectively grind the probe tip and to elongate the grinding life of the cleaning sheet, it is necessary to smoothly slide the probe tip in contact with the surface of the cleaning sheet and hence it is indispensable to improve the performance of the cleaning sheet for the purpose of realizing an ideal cleaning sheet capable of keeping the good shape of the probe tip.

Still further, as the trend has been in recent years for semiconductor electrode pads to narrow pitches and to increase the number of pins, it is expected that a probe called a membrane probe will be frequently employed in the near future in which projecting portions of electrodes are arranged in a plane without using wire material as is the case with a conventional probe card. However, there is a problem that the cleaning sheet used by the method of sticking the probe tips in the cleaning sheet can not be used for cleaning the projecting portions of such a membrane probe. Also a probe card of a vertical probe type in which wires are vertically disposed to increase the density of wire arrangement has the same problem, namely, that the cleaning sheet used by the method of sticking the probe tips in the cleaning sheet can not be used. These problems have been an obstacle for a high density probe card to come into widespread use.

SUMMARY OF THE INVENTION

The present invention has been made to solve the above problems. The object of the present invention is to provide a member for removing foreign matters adhering to a probe tip which can elongate the life of the probe by removing the foreign matters adhering to the probe tip while preventing the probe tip from being shaved and made slender and keeping the shape of the probe tip, a method of manufacturing the removing member, a method of effectively cleaning the probe by the use of the removing member, a probe cleaned by the removing member, and a probing apparatus to which the removing member is applied.

A member for removing foreign matters adhering to a probe tip in accordance with the present invention includes: a base plate; a first elastic member formed on the base plate; a second elastic member formed on the first elastic member; and an abrasive layer which is made of hard particles and a binding material and is formed on the second elastic member. Therefore, it is possible to effectively clean the foreign matters adhering to the probe tip while keeping the shape of the probe tip by using such a removing member to clean the probe.

Further, a method of manufacturing a member for removing foreign matters adhering to a probe tip in accordance with the present invention includes the steps of: forming a first elastic member on a base plate; forming a second elastic member on the first elastic member; and forming an abrasive layer made of hard particles and a binding material on the second elastic member. Therefore, it is possible to manufacture the member for effectively removing the foreign matters adhering to the probe tip while keeping the shape of the probe tip.

Still further, a method of cleaning foreign matters adhering to a probe tip in accordance with the present invention is characterized in that a probe whose tip is shaped like a nearly spherical surface or a nearly spherical surface having a flat portion at a portion is slid on the above-mentioned removing member placed on a wafer stage in such a way as to draw a closed loop path to thereby remove the foreign matters adhering to the probe tip. Therefore, it is possible to effectively clean the foreign matters adhering to the probe tip while keeping the shape of the probe tip.

Still further, a probe in accordance with the present invention has a tip shaped like a nearly spherical surface or a nearly spherical surface having a flat portion at a portion and can remove the foreign matters adhering to the probe tip by the above-described cleaning method. Therefore, by employing the present probe, it is possible to keep a contact resistance small when a measurement is made.

Still further, a probing apparatus in accordance with the present invention includes: a probe whose tip is shaped like a nearly spherical surface or a nearly spherical surface having a flat portion at a portion; the above-described member for removing the foreign matters adhering to the probe tip; and a wafer stage which can move in a horizontal direction and in a vertical direction in such a way as to slide the probe on the removing member placed thereon along a closed loop path. Therefore, it is possible to effectively easily clean the foreign matters adhering to the probe tip while keeping the shape of the probe tip which is a part of the probing apparatus.

Other objects and attainments together with a fuller understanding of the invention will become, apparent and appreciated by referring to the following description and claims taken in conjunction with the accompanying drawings.

BRIEF DESCRIPTION OF THE DRAWINGS

Preferred embodiments of the present invention will be described in detail based on the following figures, in which.

DETAILED DESCRIPTION OF THE PREFERRED EMBODIMENTS

Preferred Embodiment 1

Figure 1:
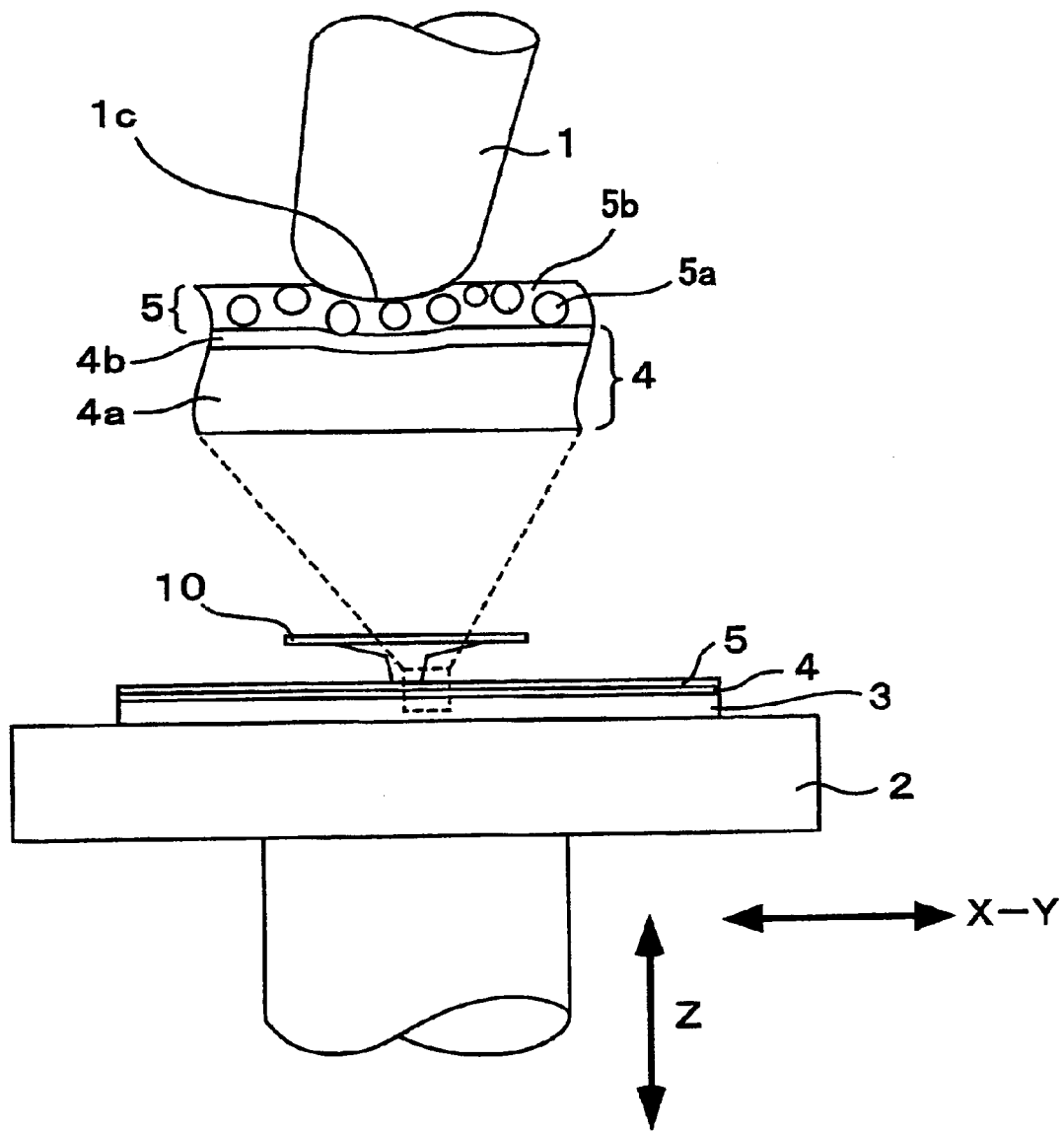
FIG. 1 is an illustration to show the constitution of an abrasive film and the contact between a probe and the abrasive film in accordance with the preferred embodiment 1 of the present invention.

FIG. 1 is an illustration to show the function of a member for removing foreign matters adhering to a probe tip in accordance with the preferred embodiment of the present invention. In FIG. 1, denoted by 1 is a probe; denoted by 1c is a spherical surface of a probe tip; denoted by 2 is a wafer table; denoted by 3 is a base plate; denoted by 4 is a member to be elastically deformed; denoted by 4a is the first elastic member; denoted by 4b is the second elastic member; denoted by 5 is an abrasive layer; denoted by 5a is a hard particle; denoted by 5b is a binding material; and denoted by 10 is a probe card, respectively. Here, in FIG. 1, the portion where the probe tip 1c is in contact with the surface of the member 4 to be elastically deformed is enlarged.

The probe card 10 which puts a probe into contact with the boding pads of a semiconductor chip to conduct a test on a semiconductor chip through which current was passed is constituted generally by metallic wires, for example, tungsten needles vertically arranged on a substrate in alignment with the arrangement of the pads. The member for removing the foreign matters adhering to the probe tip in the present preferred embodiment uses the member 4 to be flexibly elastically deformed as a cleaning sheet base material so that the abrasive layer 5 having an abrasive action is deformed along the spherical surface 1c of the probe tip. Such the member 4 to be elastically deformed is formed of two layers of the first elastic member 4a made of a material having a high capability of being flexibly deformed and the second elastic member 4b having a thin film thickness and high tensile strength so as to resist a tensile stress produced by the contact with the probe tip 1c.

The member for removing foreign matters adhering to the probe tip, that is, the cleaning sheet in accordance with the present invention will be described based on FIG. 2.

The surface of the cleaning sheet is deformed along the nearly spherical surface 1c (for example, radius of curvature R=5 $\mu$m to 30 $\mu$m) of the probe tip 1. The constitution of the cleaning sheet in accordance with the present preferred embodiment, which can be in close contact with the surface of the probe tip to which aluminum adheres, will be further described in detail. Here, as to the shape of the probe tip, the cleaning sheet is effective for the nearly spherical surface mentioned above and the nearly spherical surface, partially formed in a flat shape, of the probe tip.

(1) Constitution of Cleaning Sheet (a) First Elastic Member 4a

As to the mechanical property of the first elastic member 4a, it is preferable that the Young's modulus of the constituent material of the first elastic member 4a ranges from 5 kgf/mm$^2$ to 400 kgf/mm$^2$, further preferably, 5 kgf/mm$^2$ to 100 kgf/mm$^2$. The reason why such a range of the Young's modulus is preferable will be described in the following.

In the case where the Young's modulus of the first elastic member 4a is less than 5 kgf/mm$^2$, even if the diameter R of the spherical surface of the probe tip 1c is on the order of 5 $\mu$m to 10 $\mu$m, the cleaning sheet can be put into close contact with the region of about 80% of the spherical surface of the probe tip, that is, the region of about 80% at a diameter ratio in the projection plane. Taking into account that the diameter R of the spherical surface 1c of the probe tip is hardly 5 $\mu$m or less in actuality, the Young's modulus of 5 kgf/mm$^2$ or more of the first elastic member 4a is practically sufficient, on the other hand, in the case where the Young's modulus of the first elastic member 4a is less than 5 kgf/mm$^2$, when the probe tip is actually put into contact with the cleaning sheet, the probe tip is wrapped to a large extent with the cleaning sheet, to raise a problem that the probe tip can not smoothly slide.

Further, the maximum value of the Young's modulus depends on the diameter of the probe tip and a contact load, and there is a certain correlation between the Young's modulus of the first elastic member 4a and the shape of the probe tip and the contact force of the probe. In the case where a probe 1 having a diameter R of 30 $\mu$m to 50 $\mu$m, which is the largest conceivable diameter, is put into contact with the cleaning sheet by a conventional contact force of 5 g to 10 g, the region of the probe tip 1c to which aluminum adheres is only a circular region of, at the largest, 10 $\mu$m to 20 $\mu$m in diameter and the flexibility required to clean the circular region of this extent is about 400 kgf/mm$^2$ or less.

Further, ideally, the probe tip 1c is in contact with the cleaning sheet in such a way as to completely cover the region to which aluminum adheres, and in order to realize such a state, the Young's modulus of the first elastic member 4a is 100 kgf/mm$^2$ or less.

Therefore, as to the member for removing foreign matters adhering to the probe tip in accordance with the present preferred embodiment, for example, a silicon resin (silicon rubber) having the Young's modulus of about 100 kgf/mm$^2$ or less is used as the first elastic member 4a. However, needless to say, even the other elastic materials satisfying the above condition, that is, from 5 kgf/mm$^2$ to 400 kgf/mm$^2$, including a plate and a sheet film made of other resin material such as a urethane resin, a fluorocarbon resin, a polypropylene resin and a material having a rubber property, can produce the same effect.

In recent years, as the detrimental effect of the increasing packing density of the semiconductor chip, in order to increase pads (I/O pads) for inputting or outputting signals, there is a tendency to decrease power supply pads for supplying a driving current to the semiconductor chip to save the electric power to be consumed, whereas to increase a current passing through one power supply pad. In other words, also the current passing through a test probe in contact with the power supply pad or the ground pad increases and the welding of aluminum caused by the Joule's heat produced by contact resistance of the contact portion is becoming a problem. This welded aluminum grows in such a way that the welded area is enlarged at the probe tip 1c. Further, since the welded aluminum adhering to the probe tip 1c is strong, a small depression is formed at the probe tip 1c in some cases by the contact pressure between the probe 1 and the electrode pad of the semiconductor chip. Thus, in order to remove the welded aluminum, the cleaning sheet capable of wrapping the probe tip 1c and becoming flexibly deformed is increasingly required. It is essential for a material to have this wrapping capability, that is, flexible deformation capability that the Young's modulus of the first elastic member 4a is 400 kgf/mm$^2$ or less. In the present preferred embodiment, a two-fluid mixed hardening silicon rubber, whose hardness can be varied by a mixing ratio, is employed as one example. However, a material having such a property is not limited to the two-fluid mixed hardening silicon rubber, but a general silicon rubber whose Young's modulus is in the above mentioned range can be used as the first elastic member 4a.

The silicon rubber used in the present preferred embodiment is a very flexible material having a real Young's modulus of 10 kgf/mm$^2$ to 30 kgf/mm$^2$, and the first elastic member 4a of the cleaning sheet is formed of this material.

(b) Second Elastic Member 4b

In the member for removing the foreign matters adhering to the probe tip in accordance with the present preferred embodiment, the second elastic member 4b is formed on the surface of the first elastic member 4a described above to prevent the contact pressure of the probe from sticking the probe tip 1c into the member 4 to be elastically deformed.

For example, in the case where a probe having a probe tip of 30 $\mu$m in diameter and a tip ball of 20 $\mu$m in spherical diameter R is put into contact with the cleaning sheet by a contact force of 7 g, the tensile stress applied to the surface of the cleaning sheet is on the order of 5 kgf/mm². Thus, if the silicon rubber has a general tensile strength of a flexible silicon rubber, the probe tip 1c breaks the surface of the silicon rubber and eventually sticks in the silicon rubber. When the probe tip 1c sticks in the cleaning sheet, the probe 1 is deformed and the probe card can not be used, so this absolutely needs to be avoided. Therefore, the cleaning sheet is made resistant to the contact stress of the probe 1 by applying a coating film having a high tensile strength as the second elastic member 4b to the surface of the first elastic member 4a.

As to the tensile strength of the second elastic member 4b, it was found that even if a probe having a probe tip 1c of about 30 μm to 50 μm in spherical diameter R was put into contact with the second elastic member 4b by a contact force of about 5 g to 7 go when the second elastic member 4b had a tensile strength of less than 0.1 kgf/mm² (for example, PET film), the second elastic member 4b itself was broken. Therefore, the second elastic member 4b needs to be resistant to a tensile stress, that is, to have a tensile strength of 0.1 kgf/mm² or more, more preferably, 0.4 kgf/mm² or more, taking into account of variations in tensile strength of the material itself.

Further, since the second elastic member 4b is required to have also a flexibility capable of following the deformation of the first elastic member 4a, a material satisfying the above-mentioned two conditions is limited to a resin material which can be formed in a thin film and has a high tensile strength and high elasticity.

In the present preferred embodiment, a polyimide film was selected as a material satisfying such two conditions. In this respect, in addition to the polyimide resin, as a material satisfying the conditions of the present preferred embodiment can be used various kinds of engineering plastics such as a polyamide base resin, a POM (poly(oxymethylene)), or a PES (poly(ethersulfone)). Further, the other resin materials satisfying the material characteristics described above, for example, a laminated film of polyethylene and polyamide base resin, and a composite material reinforced by fibers of poly(vinyl chloride), can be used without any problem.

It is preferable that the second elastic member 4b is made as thin as possible so that it takes advantage of the high property of high tensile strength and at the same time follows the deformation of the first elastic member 4a. When the probe 1 is put into contact with the cleaning sheet by a general contact force ranging from 5 g to 10 g, in the case of the first elastic member 4a having the Young's modulus of several 10 kgf/mm², the amount of deformation (depression) of the first elastic member 4a becomes 10 μm or more. As a result obtained by conducting an experiment on a polyimide resin material to find the film thickness of the second elastic member 4b capable of following the amount of deformation, it was found that if the second elastic member 4b did not have a film thickness of not more than 20 μm, it did not wrap the probe tip 1c because its deformation ability (bending ability) was not sufficient. In actuality, it was found that if the film thickness of the second elastic member 4b was more than 20 μm, the deformation caused by the contact of the probe 1 was determined by the mechanical strength of the second elastic member 4b to reduce the expected effect of flexibility, which wad added especially, capable of following the deformation of the first elastic member 4a.

Further, if the above-mentioned deformation ability of the second elastic member 4b is not sufficient, for example, in the case where the probe tips 1c are arranged at narrow pitches of about 100 μm, the deformation of the cleaning sheet caused by the contact of the probe tip 1c affects the contact state of the neighboring probe. Then, when a plurality of pins are put into contact with the cleaning sheet, the contact area between the probe and the cleaning sheet becomes small for the probe between the pins. In other words, it was absolutely impossible to accomplish the object of the present invention by a method of combining a commercially available film type cleaning sheet having a base film of several 10 μm or more in thickness (having high bending rigidity and flexural rigidity) and a flexible material attached to the bottom of the cleaning sheet. Therefore, the film thickness of the second elastic member 4b employed in the present preferred embodiment is set at 20 μm or less.

Still further, as the results of the experiment, it became clear that when the film thickness of the second elastic member 4b was not more than 5 μm, the contact between the probe tip 1c and the cleaning sheet was further improved and an abrasive effect on the foreign matters adhering to the probe was further improved.

on the other hand, as to the minimum film thickness of the second elastic member 4b, in view of a problem in manufacturing, which will be described below, in order to stably control the film thickness of the second elastic member 4b, the film thickness of the second elastic member 4b needs to be set at 0.1 μm or more. Further, it was found by the experiment that the second elastic member 4b having a film thickness of 0.1 μm or less was quickly broken by the contact of the probe tip 1. It is estimated that this is because the film thickness is not uniform over the whole cleaning sheet. However, such a thickness of 0.1 μm is the minimum thickness required to stably form the second elastic member 4b, and in view of variations in the manufacturing process, the film thickness is preferably 0.5 μm or more in order to more stably form the second elastic member 4b.

According to the above consideration, the thickness of the second elastic member 4b may be summarized as follows: it was found that the thickness of the second elastic member 4b ranged preferably from 0.1 μm or more to 20 μm or less, and more preferably, from 0.5 μm or more to 5 μm or less. (c) Abrasive layer 5

An abrasive layer 5 is formed on the second elastic member 4b described above. The abrasive layer 5 needs to have two functions of removing the foreign matters adhering to the probe tip 1c and of sliding the surface of the probe tip. Then, the abrasive layer 5 is constituted by a mixed layer of hard particles 5a capable of removing the foreign matters adhering to the probe tip 1c and a binding material 5b for fixing the hard particles 5a and keeping the surface of the cleaning sheet in a comparatively smooth state.

When the hard particles 5a used as abrasive particles are largely exposed to the surface of the abrasive layer 5, as is the case with the conventional abrasive material (something called a lapping film or an abrasive tape described as an abrasive layer in Japanese Patent Laid-Open No. 300777/ 1998), there might be produced a malfunction of scratching the surface of the probe tip. Here, the scratching of the surface means a scratch having a depth of 1 μm or more.

Therefore, the abrasive layer 5 is made of a mixed layer of the hard particles 5a and the binder material 5b in which the ratio of binding material 5b to the hard particles 5a is set in such a way that the surface of the binding material 5b for fixing the hard particles 5a is broken or deformed by the contact pressure of the probe 1 to put the surfaces of the hard particles 5a into contact with the surface of the probe tip 1c. Here, the reason why the abrasive layer 5 is called especially the mixed layer is that the abrasive layer 5 needs to realize an abrasive action and at the same time a smooth sliding action with respect to the probe 1 and that also the binding material 5b including the hard particles 5a needs to share part of surface contact pressure caused by the probe 1, which is different from a conventional abrasive material in which hard particles or hard materials are put into direct contact with the probe 1.

Here, it is important that the second elastic member 4b receiving a tensile stress needs to be clearly separated from the abrasive layer 5. In other words, if the hard particles 5a to be abrasive grains are directly fixed to the second elastic member 4b receiving the tensile stress, when the probe is put into contact with the abrasive layer 5, the contact pressure of the probe 1 is directly transmitted to the second elastic member 4b via the hard particles 5a to make the hard particles 5a scratch the second elastic member 4b, resulting in a malfunction that the second elastic member 4b receiving the tensile stress is broken to stick the probe 1 into the cleaning sheet. In order to cope with such a malfunction, it is important that the abrasive layer 5 is formed of the mixed layer of the hard particles 5a and the binding material 5b to disperse the force applied to the hard particles 5a by the binding material 5b. It was found that the hard particles 5a of not more than 9 μm in particle diameter could be used from the condition of uniformly dispersing the abrasive particles with respect to the film thickness of the second elastic member 4b and the hard particles of about 5 μm in diameter could have the sufficient effect of dispersing the force. This particle diameter of 5 μm corresponds to about #3000 as a conventional cleaning sheet material. As the particle diameter of the hard particle 5a becomes smaller, it performs more effective function. However, in view of the effect of the abrasive action, it is desirable that the minimum particle diameter is 0.1 μm or more.

In the member for removing the foreign matters adhering to the probe tip in accordance with present preferred embodiment 1of the present invention, an alumina abrasive (grain size: #8000, average particle diameter: 2 μm) was used as the hard particle 5a and a resin material of urethane resin base was used as the binding material 5b. Here, the mixing ratio of both the materials was, by volume ratio, alumina abrasive particle: urethane resin =1:4 to 1:8. From the experiment results, it was found that if the amount of the urethane resin was too small, the probe 1 broke the second elastic member 4b and stuck in the cleaning sheet or the alumina abrasive grains were removed to produce dust. On the other hand, it was found that if the volume ratio of the urethane resin was too large, the abrasive efficiency of the cleaning sheet with respect to the aluminum matters adhering to the probe tip 1c was reduced.

The urethane resin employed in the present preferred embodiment had an appropriate hardness and the excellent sliding of the probe tip 1c, and thus was suitable as the binding material 5b for forming the mixed layer (abrasive layer 5) with the hard particles 5a. Further, the urethane resin could ensure a suitable wettability and a strength of adhesive bonding also with respect to a polyimide resin employed as the underlying second elastic member 4b. However, it wad found that since an engineering plastic having a high mechanical strength such as polyimide resin or the like was considerably chemically stable, in order to ensure the bonding strength to the urethane resin, it was necessary to swell and activate the surface of the polyimide resin by an organic solvent, for example, tetrahydrofuran or the like, in advance.

Further, as the experiment results, it was found that when the mixing ratio of various kinds of hard abrasive grains other than alumina abrasive grains to the urethane resin was set at a range from 5% to 70%, by a volume ratio of the hard abrasive grains to the whole abrasive layer 5, both of an excellent cleaning efficiency and an excellent sliding characteristic of the probe tip 1c could be ensured, and the abrasive layer 5 capable of compatibly producing the excellent abrasive efficiency of the foreign particles adhering to the probe tip 1c and the excellent sliding characteristic of the probe tip 1c could be realized in this range. Further, it was found that when the volume ratio of the hard abrasive grains was set at a range of 10% to 20%, such effects could be further effective.

The Japanese Patent Laid-Open No.300777/1998 described as the related art of the present preferred embodiment also discloses the mixing ratio of the binding material 5b and the hard particles 5a and that when the volume ratio of the hard particles 5a is about 80% (abrasive grains: polyester resin =4:1), good effect can be obtained. However, the experiments in the present preferred embodiment revealed the fact that, at a general mixing ratio disclosed in the related art, that is, at the volume ratio of about 80%, an abrasive efficiency to the foreign matters adhering to the probe tip 1c was be surely good, but that it was difficult to realize a good sliding action between the abrasive layer 5 and the probe tip 1c, which was another important object of the present invention. In this connection, the phrase that an abrasive efficiency was surely good means that in the case where the probe 1 was forcibly put into contact with the cleaning sheet in a relative displacement the probe 1 and the cleaning sheet repeatedly on the order of 10 times to 100 times, aluminum adhering to the probe tip 1c could be surely removed.

Although the alumina abrasive grains and the urethane resin have been taken as the constituent elements of the abrasive layer 5 in the above preferred embodiment, in addition to the alumina, diamond, silicon (Si), ceramic such as silicon carbide (SiC), and other materials having hardness capable of removing the foreign matters adhering to the probe tip 1c may be employed as the hard particles 5a.

Further, as the binding material 5b are effectively employed an epoxy base adhesive and an acrylic base adhesive as well as the urethane resin.

Still further, any material may be employed which is in close contact with and has adhesiveness to the second elastic member 4b (polyimide material in the present preferred embodiment) and has a material strength of preventing the binding material 5 from being easily separated or removed by the contact force of the probe 1.

(d) Base Plate 3

While the silicon wafer has been employed as the base plate 3 in the member for removing the foreign matters adhering to the probe tip 1c in the present preferred embodiment, a resin plate or a metallic plate can be also employed if it is formed in the shape of an orientation flat or is notched in such a way that a probing apparatus having the wafer table 2 (an apparatus for loading or unloading a wafer in which a semiconductor device is built in to conduct a probing test) can recognize the cleaning sheet and can load or unload it on the wafer table 2.

(2) Method of Manufacturing Cleaning Sheet

Next, the essential points of a method of manufacturing the member having the above constitution and for removing the foreign matters adhering to the probe tip, that is, the cleaning sheet will be described. In order to form the second elastic member 4b as a thin film of 20 μm or less in thickness on the first elastic member 4a, the following contrivances need to be made.

First, it is necessary to ensure the flatness of the first elastic member 4a. Naturally, in order to put many probe tips 1c into contact with the surface of the cleaning sheet at the same time, the flatness of the cleaning sheet needs to be reduced to the order of 10 μm, which is a half of general variations of ±10 μm the height of the probe tip 1c. Further, also from the viewpoint of forming the thin film made of the second elastic member 4b and having a uniform thickness of 20 μm or less on the surface of the first elastic member 4a by a spin coat method, the flatness of the cleaning sheet needs to be not more than 10 μm.

Figure 2:
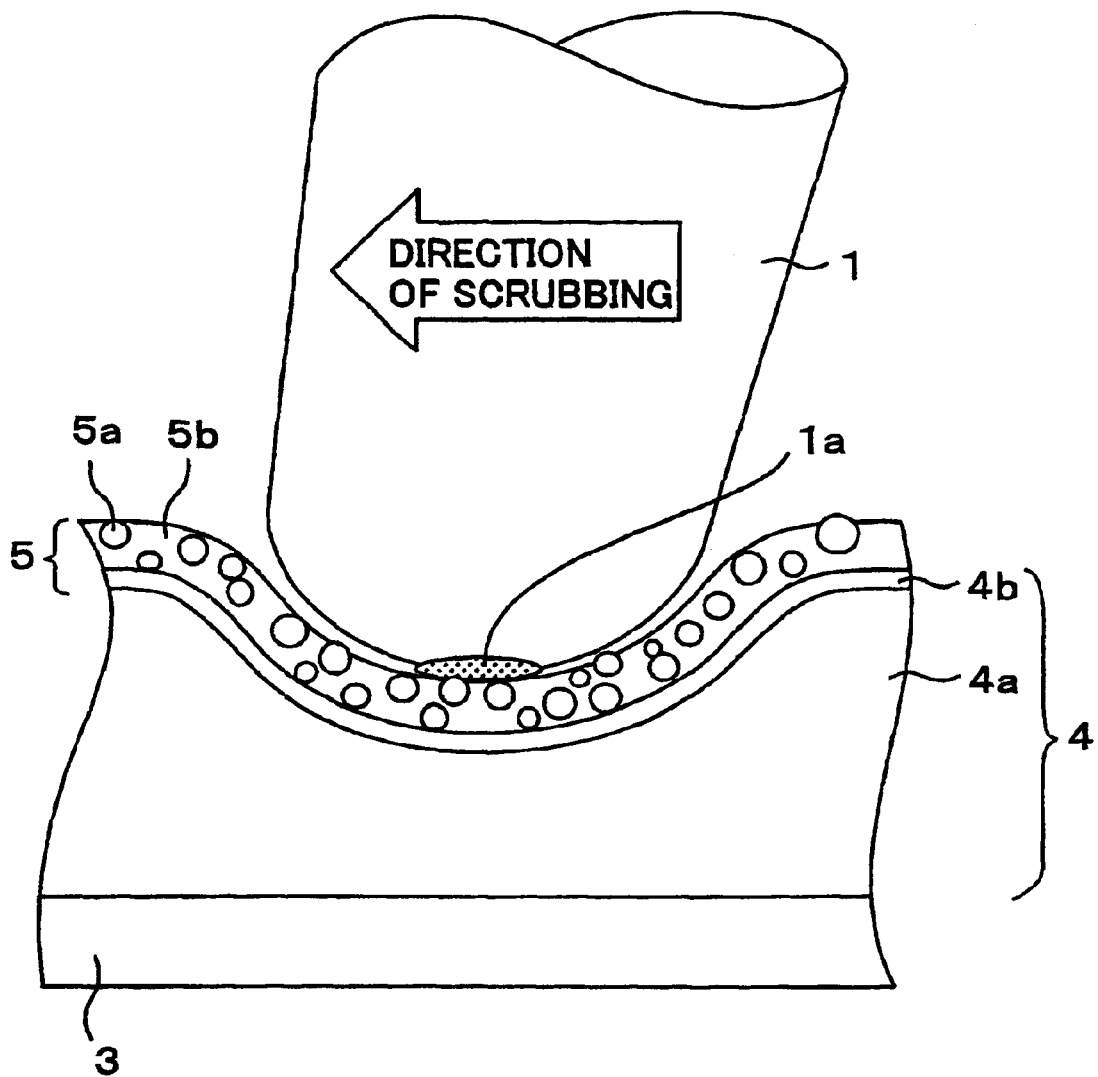
FIG. 2 is a detailed illustration to show the contact between the abrasive film and the probe in accordance with the preferred embodiment 1 of the present invention.

Then, as a method of forming the first elastic member 4a was employed a method of flowing two-liquid mixed hardening silicon material on the surface of the base plate 3, as a substrate material, shown in FIG. 1 or FIG. 2, and press-working it by the use of a die whose flatness and parallelism are ensured. By this method, the flatness of the surface of the first elastic member 4a could be reduced to not more than 10 μm. Here, the employed substrate material was an 8-inch silicon wafer and the flatness of the substrate material itself was not more than 5 μm.

In general, the variations in the height of several to several thousand probes 1 arranged on a probe card are on the order of 20 μm in terms of (Max–Min), and the flatness of the first elastic member 4a itself is 10 μm, and the variations in positioning the height of the wafer table 2 of the probing apparatus is 10 μm. For this reason, in order to put all the probe tips 1c of a plurality of probes 1 disposed on the probe card into good contact with the cleaning sheet, the film thickness of the first elastic member 4a needs to be 50 μm or more when making allowance for the depression stroke of the first elastic member 4a. From this point of view, the film thickness of the first elastic member 4a was set at 100 μm in the present preferred embodiment. However, it was found in the experiment conducted for the present invention that even if the first elastic member 4a was 30 μm in film thickness, it could exert the minimum function because the probes 1 were put into contact with the cleaning sheet to slightly correct the variations in the height of the probe tips 1c.

Although the first elastic member 4a was formed by press-working in the present preferred embodiment, if a silicon rubber sheet having a uniform thickness is placed on the top of the base plate 3, it can be used as the first elastic member 4a without any problem.

Next, it is necessary to form the second elastic member 4b of a thin film on the surface of the first elastic member 4a. Although the spin coat method is the most suitable for uniformly stably forming a thin film of 20 μm or less in thickness, the spin coat method requires the raw material of the second elastic member 4b to be liquid in the initial state. The polyimide resin used in the present preferred embodiment was the best material as a material capable of exerting a function that it was liquid in the initial state and could be thinly coated and cured to form a thin film having a high tensile strength. However, the polyimide resin needs to be baked when it is cured, whereas the silicon rubber is used as the first elastic member 4a. Therefore, there is a restriction that a baking temperature needs to be less than the heat resistance temperature of the silicon rubber.

Thus, the polyimide material having a baking temperature of 300° C. or less was selected to constitute the second elastic member 4b in the present preferred embodiment. Further, before the raw material of the polyimide was applied to the silicon rubber, the surface of the silicon resin was cleaned and activated by an organic solvent such as NMP (N-2 methylpyrrolidone) or the like to improve wettability. However, a film made of polyimide, polyamide or the like and having a thickness of 20 μm or less may be prepared and laminated on the surface of the first elastic member 4a by a lamination method using a vacuum press or a roller. Needless to say, the mass production of the second elastic member 4b can be industrially facilitated by the lamination method.

Here, an important point is as follows: even if a conventional cleaning sheet which has been previously known as an alternative of a combination of the second elastic member 4b and the abrasive layer 5 as described in the present invention, that is, a cleaning sheet whose base material is several tens μm in thickness is used as it is, it can not be deformed along the shape of the probe tip because the bending rigidity or the flexural rigidity of the base material is too large. Therefore, even if a commercially available cleaning sheet with the thinnest base material is used, the contact area of the probe tip and the cleaning sheet becomes only about one third of the diameter of the probe tip.

In contrast to this, by applying the second elastic member 4b of 20 μm or less in thickness as described in the present preferred embodiment, it is possible to produce a cleaning sheet capable of covering about 80% of the probe tip having a general probe tip diameter (φ=10 μm to 60 μm).

As described above, by forming the first elastic member 4a having flexibility on the base plate 3, which is the substrate material, and then forming the second elastic member 4b made of a resin thin film having a thickness of 0.1 μm to 20 μm on the first elastic member 4a, and then forming the abrasive layer 5 made of the hard particles 5a and the binder material 5b, which were mixed at the above-mentioned predetermined ratio on the second elastic member 4b, it was possible to manufacture the cleaning sheet which could be deformed along the shape of the probe tip and effectively remove the foreign matters adhering to the probe tip 1c.

The cleaning sheet of the present invention is designed so that the total thickness of the base plate 3, the elastically deformed member 4, and the abrasive layer 5 is not more than 1.5 mm. By limiting the thickness of the cleaning sheet and reducing the weight thereof, it is possible to reduce the load of the loader of the probing apparatus and to use the conventional wafer carrying jig as it is and hence to load or unload the cleaning sheet as if it were a semiconductor wafer. However, even if the total thickness of the cleaning sheet of the present invention is 1.5 mm or more, the essential effect of the cleaning sheet can not be lost.

Preferred Embodiment 2

Figure 3:
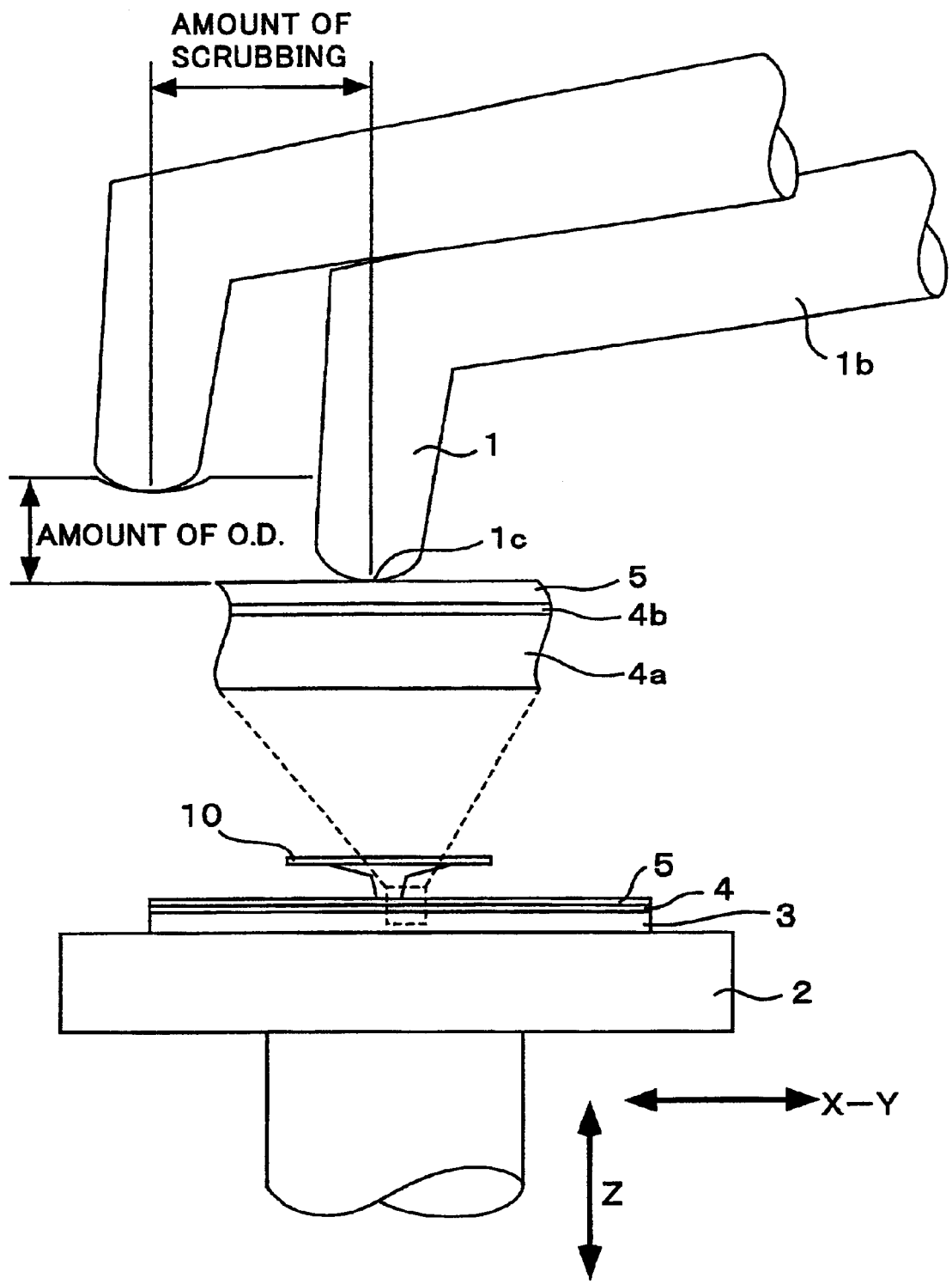
FIG. 3 is an illustration to show a concept of the over drive of a cleaning sheet in accordance with the preferred embodiment 1 and the preferred embodiment 2 of the present invention.
Figure 4A:
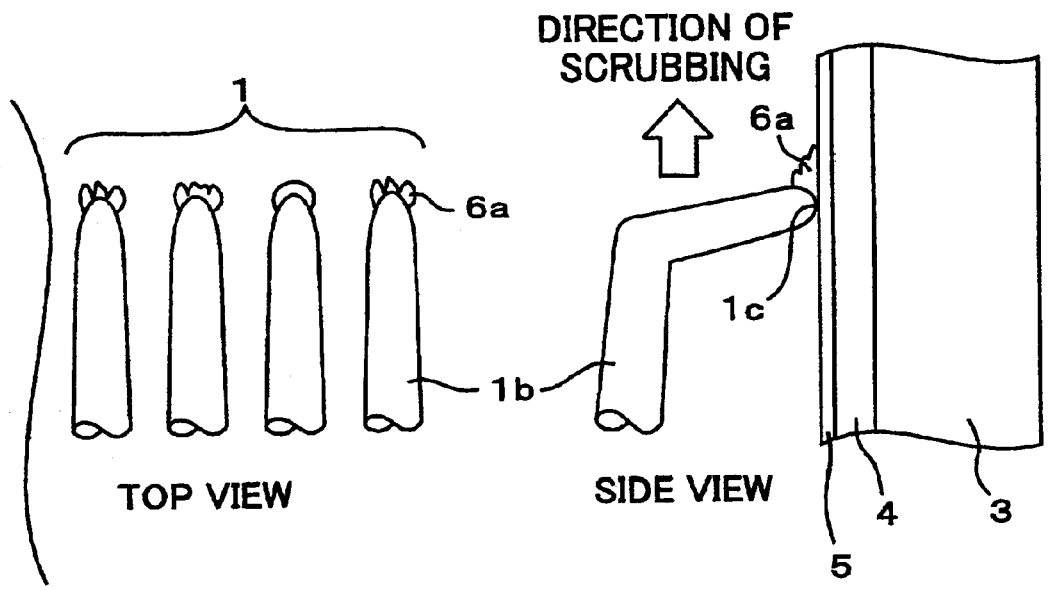
FIG. 4 is an illustration to show the path when the probe slides on the cleaning sheet in accordance with the preferred embodiment 2 of the present invention.
Figure 4B:
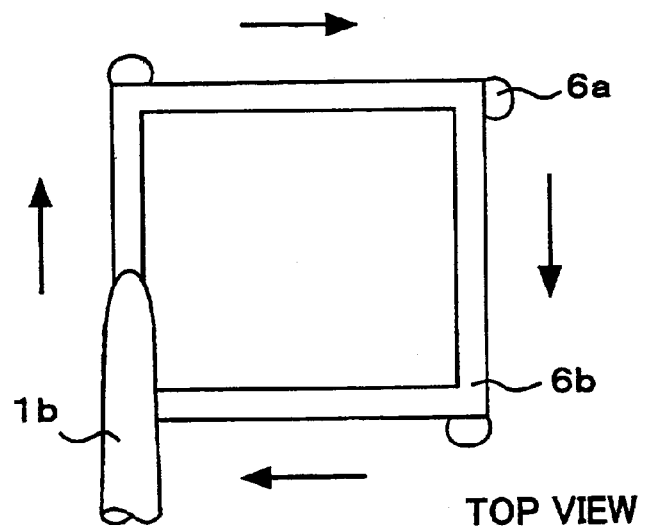

A method of cleaning a probe to which a member for removing foreign matters adhering to a probe tip in the second preferred embodiment 2 is applied will be described based on FIG. 3 and FIG. 4. In the drawings, reference characters 1b, 6a, and 6b denote a probe horizontal part, a scratched foreign matter, and a scrubbed flaw, respectively.

As described in the preferred embodiment 1, as the capacity of the semiconductor chip is becoming larger especially in recent years, there is a tendency to increase a current passing through the power source or the ground. Thus, the contact pressure of the probe 1 and the heat generated by the increased current produce a synergetic effect to increase the amount of aluminum welded to the probe tip 1c. For example, in the DRAM, the current is supplied in a pulse at predetermined intervals of time for a refreshing action to keep the content of the memory and, in some case, the current passing through the power source pin of the semiconductor chip reaches 300 mA (in-rush current), though instantaneously. Assuming that the diameter R of a sphere at the probe tip is 30 μm, the current density at this portion reaches a level more than 400 A/mm$^2$ and sometimes instantaneous heating increases the temperature of the probe tip 1c to several hundred degrees centigrade, though instantaneously.

For this reason, even in the case where a probe made of tungsten having a high melting point was used, as shown in FIG. 2 of the preferred embodiment 1, the phenomenon occurred that aluminum which was the foreign matter 1a adhering to the probe tip 1c bit into and adhered to the probe material side. The aluminum biting in and adhering to the probe side could not be easily removed by the conventional cleaning sheet and such an adhering aluminum formed a nuclei and further expanded the region where aluminum adhered to the probe, thus degrading electric contact performance of the probe. This was found out by the study of the present inventors.

A conventional cleaning method and a cleaning method of the present preferred embodiment, both using a probing apparatus used for a wafer test, will be described based on FIG. 3. Here, for the sake of convenience, the cleaning sheet shown in FIG. 3 is not the conventional one but the one of the preferred embodiment 1.

In a probe card called a cantilever type, the probe 1 arranged on the substrate of the probe card 10 is constituted by a part having a probe tip spherical surface 1c and nearly vertically erected and a probe horizontal part 1b connected to the probe card 10 and fixed to the substrate of the probe card 10. In the conventional cleaning sheet, the probe tip 1c of the probe card 10 is put into slight contact with the cleaning sheet placed on the wafer table 2 (also referred to as wafer chuck top) of the probing apparatus and then is stuck into the cleaning sheet by an action called an over drive (O. D.) action, that is, an action in the Z (vertical) direction of the wafer table 2 to clean the probe tip 1c. Instead of this action of sticking the probe tip 1c into the cleaning sheet, by sliding the probe tip 1c on the surface of the cleaning sheet described in the preferred embodiment 1, the probe tip 1c can be cleaned.

In other words, in the cleaning sheet of the preferred embodiment, since the member 4 having two layers and elastically deformed is provided as an underlying member of the abrasive layer 5 exerting a cleaning function, it became possible to produce a sliding action by moving the wafer table 2 in the Z direction. This sliding action is produced as follows: as shown in FIG. 3, the spherical surface of the probe tip is put into contact with the surface of the cleaning sheet and then the wafer table 2 is moved up (over driven) in the z direction, whereby the probe 1 is lifted and at this time the probe horizontal part 1b is turned upward to produce the sliding action (amount of scrubbing) of the probe 1 on the cleaning sheet.

In the case of the conventional cleaning sheet, the probe tip 1c bites into the cleaning sheet immediately after the over drive. However, the cleaning sheet of the preferred embodiment 1, whose surface is not broken, supports a reactive force from the probe 1 (tensile stress produced at the contact portion) and bends and turns upward the probe horizontal portion to move the probe tip on the cleaning sheet, resulting in a certain scrubbing action, that is, a sliding action.

In the case where a general probe card is used, the over drive of 70 $\mu$m produces the sliding action of about 20 $\mu$m to 30 $\mu$m (the amount of sliding action varies with variations in the height of the probe). This sliding action puts the foreign matters adhering to the probe tip 1c into contact with the ceramic member of the cleaning sheet to produce a friction action, whereby the foreign matters adhering to the probe tip 1c are removed. However, the amount of the sliding action of the probe produced by the motion in the Z direction, or in the vertical direction of the wafer table 2 by the use of the conventional method is on the order of 30 $\mu$m per one action, so the contact action needs to be repeated many times to completely remove the adhering foreign matters.

On the other hand, by the use of the property of the cleaning sheet of the present invention that the cleaning sheet is not broken by the contact stress produced at the probe tip 1c and can slide the probe tip 1c in contact with the surface of the cleaning sheet, it is possible to provide a cleaning method having higher efficiency. In other words, by providing the wafer table 2 with a predetermined over drive in the Z direction and then moving the wafer table 2 in the X - Y direction, namely, in the horizontal direction, it is possible to provide a sliding action of a long distance at a stretch. According to this cleaning method, only one sliding action of 30 mm corresponds to 1000 repetitions of the over drive of 30 $\mu$m in the Z direction according to the conventional cleaning method.

Further, according to such a cleaning method, the sliding action can be produced with the most effective contact pressure kept constant. Therefore, it is possible to produce an effect of producing an abrasive efficiency of the adhering foreign matters extremely higher than would be obtained from a simple calculation proportional to the number of repetitions.

In this connection, this cleaning method is the one which can not be realized by the conventional cleaning sheet of the probe tip sticking type, or the cleaning sheet whose portion corresponding to the second elastic member 4b is constituted by a thick base film.

Preferred Embodiment 3

When the probe tip 1c is slid a long distance on the cleaning sheet of the preferred embodiment 1, the probe tip 1c scratches the constituent material of the abrasive layer 5 of the surface of the cleaning sheet and the scratched constituent material is attached to the probe tip 1c in some case. In this case, if the path of the sliding action of the probe tip 1c with respect to the cleaning sheet is set in advance in the shape of a closed loop, for example, in the action of a square closed loop as shown in FIG. 4, the scratched constituent material 6a is separated from the probe 1 at each corner to solve the above problem. Further, if the probe is slid one or more turn in the shape of the closed loop, the probability can be increased that the scratched constituent material will be left on the cleaning sheet side.

Further, the probability that the scratched constituent material will be left on the cleaning sheet side can be increased by a continuous action in a zigzag pattern or in the shape of a letter S in addition to the action of the closed loop.

Here, the shape of the closed loop is not limited to a circle or a square. Further, it is expected that only a simple oscillating action can produce the same effect but, if it is taken into account that the probing apparatus has backlash and play, it can be said that also the simple oscillating action draws a closed loop path in the strict sense.

Figure 5:
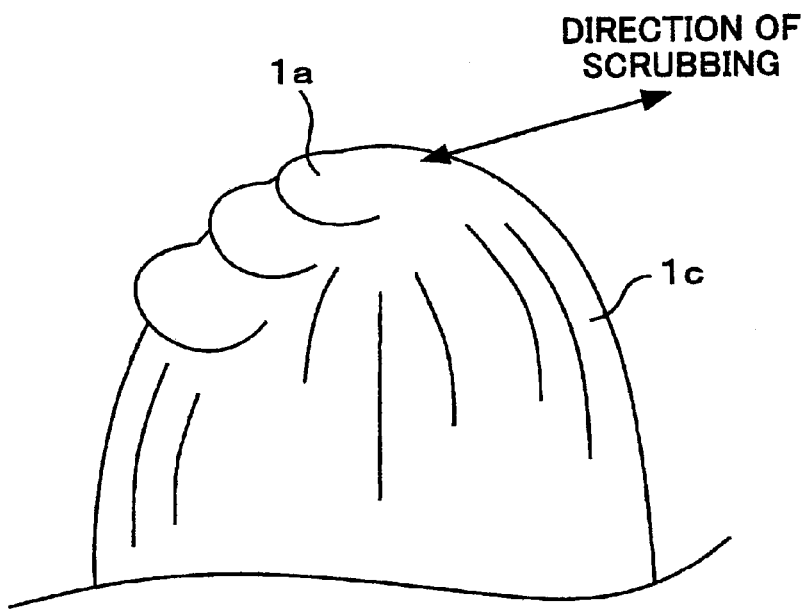
FIG. 5 is a schematic illustration based on the SEM observation photograph of a probe tip to which aluminum adheres.
Figure 6:
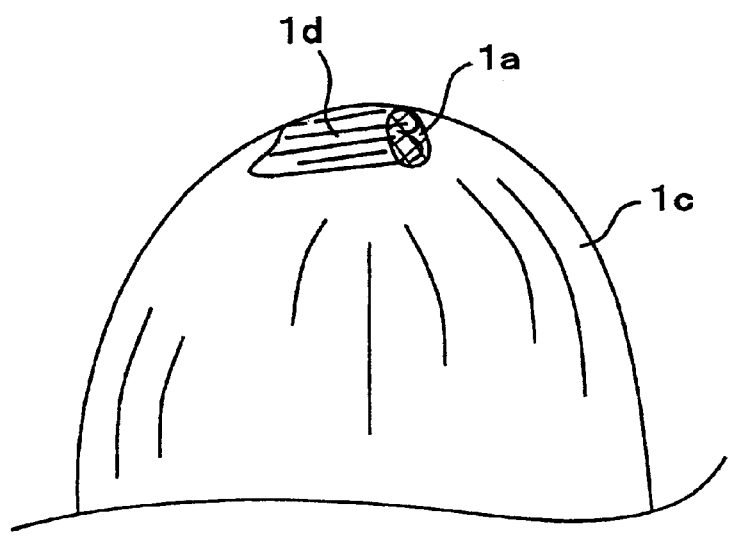
FIG. 6 is a schematic illustration based on the SEM observation photograph of a probe tip when a conventional cleaning sheet is used.

In FIG. 5 is shown a schematic view of an observation image, by a SEM (scanning electron microscope), of the aluminum attached to the probe tip 1c by the repeated probing tests. The effects of cleaning the probe, to which aluminum is attached, by the conventional cleaning sheet and the cleaning sheet according to the present invention are shown for comparison in FIG. 6 and FIG. 7, respectively, each of which shows the observation image of the probe by the SEM in the schematic view. Here, in the figures, a reference character 1d denotes an abrasive flaw.

It was found that a flaw caused by the contact of the probe tip 1c with the cleaning sheet was formed in the direction of sliding on the probe tip 1c cleaned by the conventional cleaning sheet. It can be seen from FIG. 6 that the aluminum adhering to the probe tip 1c is almost removed but that a small amount of adhering matters 1a, that is, aluminum is left at the edge of the cleaning region because the flexibility of the cleaning sheet is not sufficient. Further, it is clear from the trace of the flaw of the probe tip 1c that the contact area is only about one third of the diameter of the probe tip (30 μm in this case).

Figure 7:
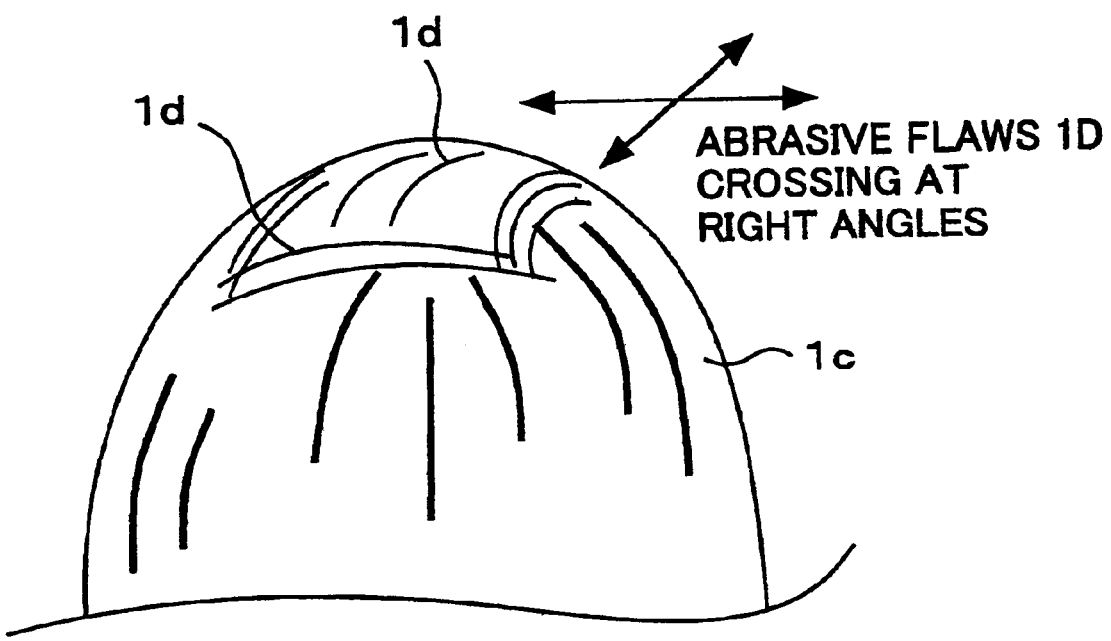
FIG. 7 is a schematic illustration based on the SEM observation photograph of a probe tip when a cleaning sheet in accordance with the present invention is used.

FIG. 7 is a schematic view of the observation image of the probe tip 1c by the SEM when the probe tip 1c was cleaned by the closed loop sliding path (square path) produced by moving the wafer table of the probing apparatus in accordance with the preferred embodiment 2 by the use of the cleaning sheet in accordance with the preferred embodiment 1 (in this case, the amount of forced contact, that is, the amount of over drive becomes 50 μm). It is evident from FIG. 7 that the adhering aluminum is almost completely removed from the probe tip 1c.

Further, since the probe tip 1c was slid on the square closed loop path, abrasive flaws 1d crossing at right angles each other were observed on the surface of the probe tip. It was found that the abrasive flaws 1d crossing at right angles could produce the effect of shallowing the depths of the flaws caused by the abrasion. The roughness of the surface of the probe tip 1c shown in FIG. 7 was in a mirror state whose roughness Rmax was below 0.1 μm and it was verified in the contact resistance measurement experiment conducted thereafter that the cleaning sheet showed a very stable contact resistance of not more than 0.5 Ω even under the severe condition of 50,000 contacts.

Further, it was verified from the flaw 1d caused by the abrasion that the probe tip was cleaned in the area of 80% or more of the diameter of the probe tip. The probe card used in this experiment had 20 pins with a pitch of about 200 μm between the probes and the state shown in FIG. 7 was recognized for all the probes. Here, these results were obtained by the observation of the probe tip performed by the present inventors by the use of the SEM.

In this respect, when performing the cleaning of the probe tip by moving the wafer table in the X - Y plane, in order to produce a sliding action of total amount of 0.6 mm or more (the amount of sliding 30 μm/ time ×20 times), which was estimated from the general number of cleanings in the Z direction, the conventional probing apparatus was required to be modified.

From the results described above, the cleaning sheet and the method of cleaning by moving the wafer table in accordance with the present invention are thought to become essential for the method of cleaning the probe tip of the probe card of the vertical type, or the probe card of the membrane type in which projections for electric contact are arranged in a plane, each of which is expected to come into wide use in the near future.

As a comparison, the probe was slid on the conventional cleaning sheet along the closed loop path by moving the X - Y wafer table 2 in the horizontal direction. As the result, it was found that even if the amount of over drive was on the order of 50 μm or less, the reactive force produced by the cleaning sheet became large and hence also a friction resistance was increased and that when the probe was slid in the lateral direction with respect to the direction in which the probe was originally slid, in other words, to the direction parallel to the probe, the probe was deformed.

Preferred Embodiment 4

Figure 8:
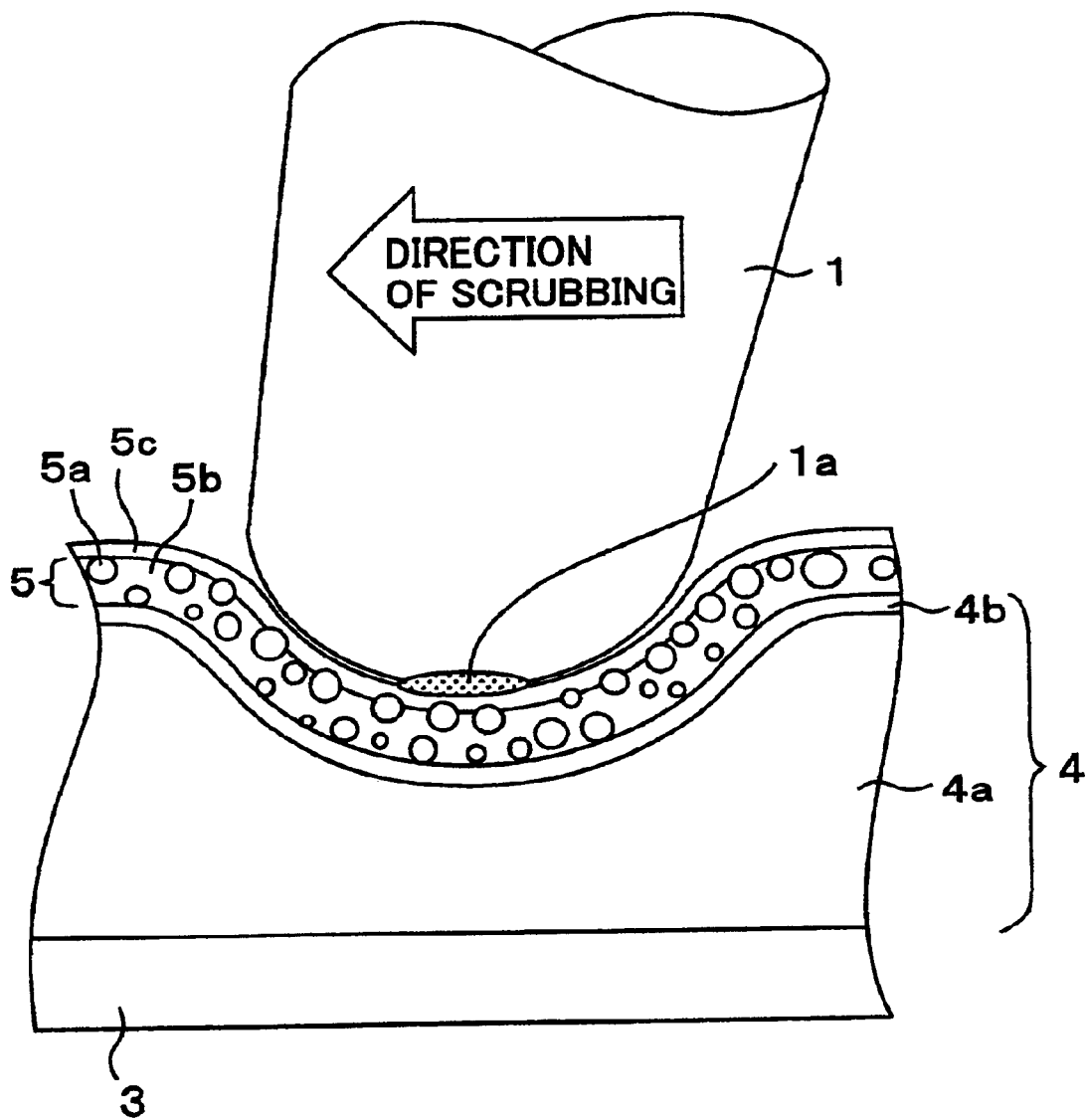
FIG. 8 is an illustration, in accordance with the preferred embodiment 3 of the present invention, to show the cross-sectional constitution of a cleaning sheet in which the cleaning sheet of the preferred embodiment 1 is provided with an over- coat for preventing dust.
Figure 9:
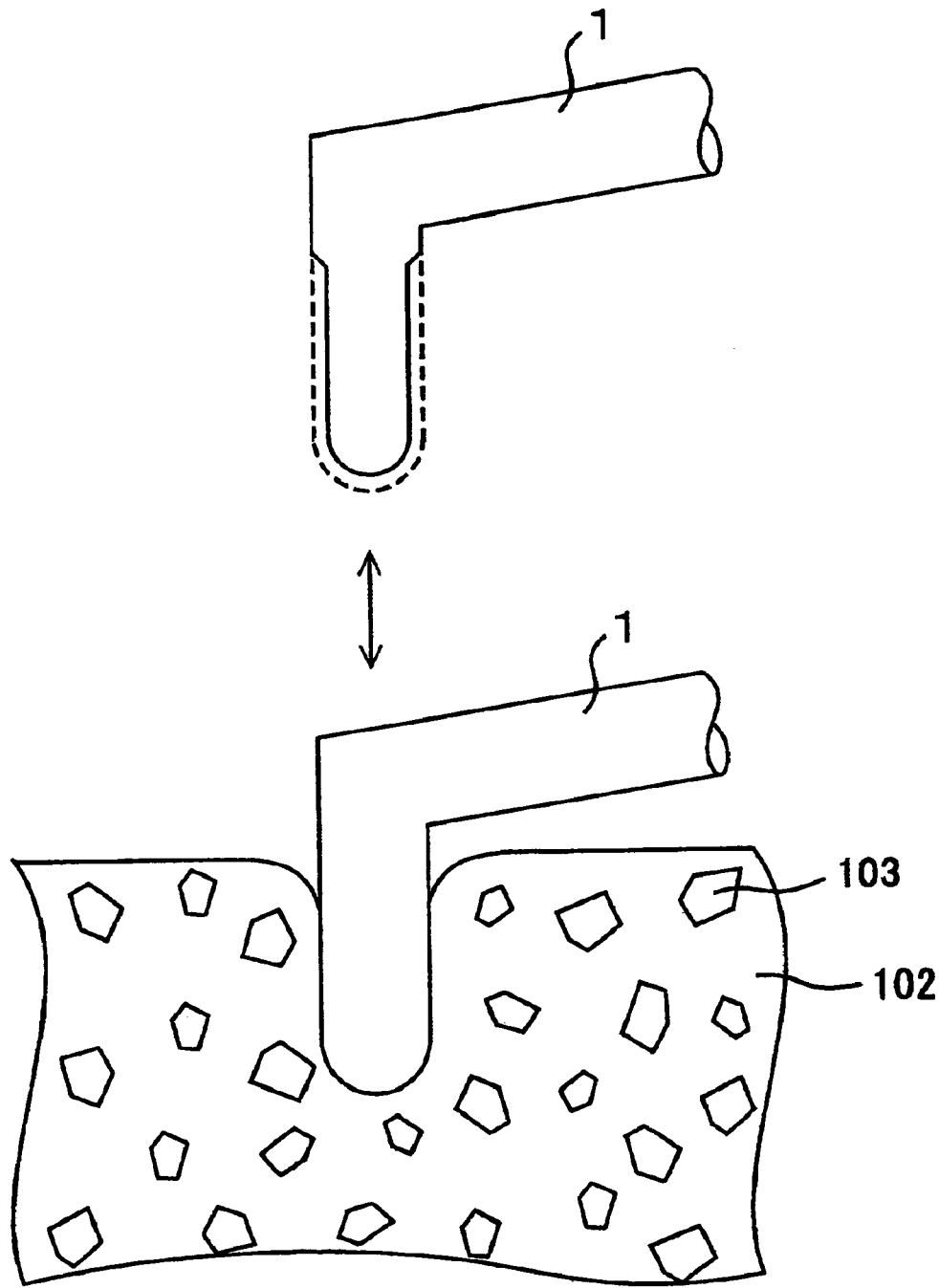
FIG. 9 is an illustration to show a cleaning method by the use of a conventional cleaning sheet.

Next, the member for removing the foreign matters adhering to the probe tip in accordance with the preferred embodiment 4 of the present invention will be described based on FIG. 8. In FIG. 8, a reference character 5c designates an over- coat film.

As described in the preferred embodiment 2, when the cleaning sheet in accordance with the preferred embodiment 1 was used at high abrasive efficiency, in some case, the foreign matters adhering to the probe tip, hard particles, and binder material on the surface of the cleaning sheet are removed to cause dust.

Thus, in the member for removing the foreign matters adhering to the probe tip in accordance with the present preferred embodiment, an over- coat film 5c made of soft metal is formed on the surface of the abrasive layer 5 of the cleaning sheet described in the preferred embodiment 1. Since the soft metal is used as the over- coat film 5, the soft metallic film can catch the dust caused by the abrasion described above to effectively prevent the dust. Here, the soft metal means a metal having an elongation of 10% or more, for example, aluminum, copper, gold, and silver.

While the contact of the probe tip with the cleaning sheet was visually checked by the use of a microscope in the conventional probing apparatus, the contact of the probe with the cleaning sheet can be electrically detected by forming the over- coat film 5c of a conductive soft metallic film on the surface of the cleaning sheet in accordance with the preferred embodiment 1, which can provide a more correct amount of over drive.

In the present preferred embodiment, the over- coat film 5c is formed by sputtering aluminum and the film thickness of the aluminum is set at 0.5 μm or less. This is because as the thickness of the over- coat film is increased, dust preventive effect is increased, but abrasive efficiency is decreased and hence the thickness of the over- coat film needs to be set at an appropriate thickness.

It was verified by an experiment that if the film thickness of the over- coat film 5c was more than 3 μm, the abrasive efficiency deteriorated. Further, it was verified by an experiment that if the film thickness of the over- coat film 5c was less than 0.01 μm, the dust preventive effect was reduced. Therefore, it is preferable that the effective film thickness of the over- coat film 5c ranges from 0.01 μm or more to 3 μm or less.

While aluminum is taken as an example of the material of the over- coat film 5c in the present preferred embodiment, a metallic material other than aluminum which has an large elongation and does not increase electric resistance to a remarkable extent, such as gold, silver, copper, or the other soft metal may be used without any problem.

In this connection, while the object to be inspected by the probe has been described as the semiconductor chip, for the sake of convenience, in the preferred embodiments, needless to say, the present invention can be applied also to, for example, a display device like a liquid crystal display.

Since the member for removing the foreign matters adhering to the probe tip in accordance with the present invention is constituted by the base plate, the first elastic member formed on the base plate, the second elastic member formed on the first elastic member, and the abrasive layer made of hard particles and the binder material and formed on the second elastic member, it is possible to effectively clean the foreign matters adhering to the probe tip while keeping the shape of the probe tip.

Since the method of manufacturing the member for removing the foreign matters adhering to the probe tip in accordance with the present invention includes the steps of forming the first elastic member on the base plate, forming the second elastic member on the first elastic member, and forming the abrasive layer made of hard particles and the binder material on the second elastic member, it is possible to manufacture, with good reproducibility, the member for effectively removing the foreign matters adhering to the probe tip while keeping the shape of the probe tip.

According to the method of cleaning the foreign matters adhering to the probe tip in accordance with the present invention, the probe whose tip is shaped like a nearly spherical surface or a nearly spherical surface having a flat portion at a portion is slid on the above-mentioned removing member placed on the wafer stage in such a way as to draw the closed loop path to remove the foreign matters adhering to the probe tip. Therefore, it is possible to effectively clean the foreign matters adhering to the probe tip while keeping the shape of the probe tip.

According to the probe in accordance with the present invention, the tip of the probe is shaped like a nearly spherical surface or a nearly spherical surface having a flat portion at a portion and the foreign matters adhering to the probe tip are removed by the above-described cleaning method. Therefore, it is possible to provide a probe capable of keeping the contact resistance at a small value when a measurement is made.

Since the probing apparatus in accordance with the present invention includes the probe whose tip is shaped like a nearly spherical surface or a nearly spherical surface having a flat portion at a portion, the member for removing the foreign matters adhering to the probe tip, and the wafer stage movable in the horizontal direction and in the vertical direction so that the probe can slide on the removing member placed thereon along the closed loop path, it is possible to effectively easily clean the foreign matters adhering to the probe tip while keeping the shape of the probe tip which is a part of the probing apparatus.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A member for removing foreign matters adhering to a probe tip, the member comprising:
   a base plate;
   a first elastic member formed on the base plate;
   a second elastic member formed on the first elastic member; and
   an abrasive layer, on the second elastic member, the abrasive layer including a matrix of binding material and hard particles dispersed in the binding material, wherein the second elastic member has a thickness from 0.1 $\mu$m to 20 $\mu$m.

2. The member for removing foreign matters adhering to a probe tip as claimed in claim 1, wherein the Young's modulus ranging from 5 kgf/mm$^2$ to 400 kgf/mm$^2$.

3. The member for removing foreign matters adhering to a probe tip as claimed in claim 1, wherein the second elastic member has a tensile strength of at least 0.1 kgf/mm$^2$.

4. The member for removing foreign matters adhering to a probe tip as claimed in claim 1, wherein the hard particles fill from 5% to 70% of the volume of the abrasive layer.

5. The member for removing foreign matters adhering to a probe tip as claimed in claim 1, wherein the hard particles have diameters from 0.1 $\mu$m to 9 $\mu$m.

6. The member for removing foreign matter adhering to a probe tip as claimed in claim 1, further comprising an over-coat film of a soft metal selected from the group consisting of gold, silver, copper, and aluminum, on the surface of the abrasive layer.

7. The member for removing foreign matter adhering to a probe tip as claimed in claim 6, wherein the over-coat film has a thickness from 0.01 $\mu$m to 3 $\mu$m.

8. A method of manufacturing a member for removing foreign matter adhering to a probe tip, the method comprising:
   forming a first elastic member on a base plate;
   forming a second elastic member on the first elastic member; and
   forming an abrasive layer on the second elastic member, the abrasive layer including a matrix of a binding material and hard particles dispersed in the binding material, wherein the second elastic member has a thickness from 0.1 $\mu$m to 20 $\mu$m.

9. The method of manufacturing a member for removing foreign matter adhering to a probe tip as claimed in claim 8, wherein the first elastic member has a Young's modulus from 5 kgf/mm$^2$ to 400 kgf/mm$^2$.

10. The method of manufacturing a member for removing foreign matter adhering to a probe tip as claimed in claim 8, wherein the second elastic member has a tensile strength of at least 0.1 kgf/mm$^2$.

11. The method of manufacturing a member for removing foreign matter adhering to a probe tip as claimed in claim 8, including mixing the hard particles and the binding material so the hard particles occupy from 5% to 70% of the volume of the abrasive layer.

12. The method of manufacturing a member for removing foreign matter adhering to a probe tip as claimed in claim 8, wherein the hard particles have diameters from 0.1 $\mu$m to 9 $\mu$m.

13. The method of manufacturing a member for removing foreign matter adhering to a probe tip as claimed in claim 8, comprising forming an over-coat film of a soft metal selected from the group consisting of gold, silver, copper, and aluminum, on the abrasive layer.

14. A method of cleaning foreign matter adhering to a probe tip having a nearly spherical surface or a nearly spherical surface having a flat portion at a portion slid on a member for removing the foreign matter adhering to the probe tip, wherein the member includes a base plate placed on a wafer stage, a first elastic member on the base plate, a second elastic member on the first elastic member, and an abrasive layer, including a binding material as a matrix and hard particles dispersed in the matrix, on the second elastic member, the method including sliding the surface of the probe tip in a closed loop path on and in contact with the abrasive layer of the member to remove the foreign matter adhering to the probe tip.

15. A probing apparatus comprising:
   a probe having a tip with a nearly spherical surface or a nearly spherical surface having a flat portion; and
   a member for removing foreign matter adhering to the probe tip, wherein the member includes a base plate, a first elastic member on the base plate, a second elastic member on the first elastic member, and an abrasive layer, including a binding material as a matrix and hard particles dispersed in the matrix, on the second elastic member, the abrasive layer including a matrix of a binding material and hard particles dispersed in the binding material, wherein the second elastic member has a thickness from 0.1 $\mu$m, the member being placed on a wafer stage, which can move in two orthogonal directions to slide the probe tip on in contact with the member along a closed loop path.

* * * * *